(12) United States Patent
Rieger et al.

(10) Patent No.: US 7,564,237 B2
(45) Date of Patent: Jul. 21, 2009

(54) INTEGRATED 3-AXIS FIELD SENSOR AND FABRICATION METHODS

(75) Inventors: Ryan W. Rieger, Brooklyn Center, MN (US); Hong Wan, Plymouth, MN (US); Andrzej Peczalski, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/877,537

(22) Filed: Oct. 23, 2007

(65) Prior Publication Data
US 2009/0102475 A1 Apr. 23, 2009

(51) Int. Cl.
*G01R 33/02* (2006.01)
(52) U.S. Cl. .................. 324/244; 324/260; 324/262
(58) Field of Classification Search .......... 324/247, 324/251, 252, 207.21, 249, 260, 262, 244, 324/117 R, 117 H; 338/32 R, 32 H
See application file for complete search history.

(56) References Cited

U.S. PATENT DOCUMENTS 6,812,690 B2 * 11/2004 De Jong et al. .......... 324/158.1
7,126,330 B2   10/2006 Peczalski et al.

\* cited by examiner

*Primary Examiner*—Reena Aurora
(74) *Attorney, Agent, or Firm*—Fogg & Powers LLC

(57) ABSTRACT

A multi-axis magnetic or other field sensing device and method of fabricating a multi-axis magnetic or other field sensing device. An example sensing device is a 3-axis sensor package on a substrate with sensors on opposing sides of the substrate. One side of the substrate includes an X-axis sensor and a Y-axis sensor (or alternatively an integrated X-Y-axis sensor) and the opposite side of the substrate includes a Z-axis sensor on at least one sloped surface, the surface sloped with respect to both the first and second surface areas. One surface is mechanically and electrically bonded to a circuit board via conductive bumps. The other surface electrically connects to the circuit board through bonded wires and/or vias formed through the substrate.

20 Claims, 6 Drawing Sheets

INTEGRATED 3-AXIS FIELD SENSOR AND FABRICATION METHODS

BACKGROUND OF THE INVENTION

Magnetic sensing devices facilitate the measurement of a magnetic field (i.e. one or more magnetic fields) for a variety of applications by using one or more magnetic sensor units to sense the magnetic field, and to provide output signals that represent the magnetic field. Navigation applications that determine a heading determination are popular applications for magnetic sensing devices. A heading determination may indicate a direction, such as North or North-East. Other applications for magnetic sensing devices, such as proximity detection, are also possible.

The one or more magnetic sensor units in a magnetic sensing device may be arranged in a manner that provides sensing of particular components of a magnetic field. For example, a first magnetic sensor unit may be arranged to sense a component of a magnetic field in a direction defined as the x-axis direction, and a second magnetic sensor unit may be arranged to sense a component of the magnetic field in a direction defined as the y-axis direction. In this example, the magnetic sensing device could have a first output to provide an output signal that represents components of the magnetic field in the x-axis direction and a second output to provide an output signal that represents components of the magnetic field in the y-axis direction.

A wide variety of magnetic sensor unit types are available such as reed switches, variable reluctance sensors, flux-gate magnetometers, magneto-inductor sensors, spin-tunnel device sensors, and Hall-Effect sensors. Another magnetic sensor unit type is a magnetic sensor unit that comprises magnetoresistive material. Examples of magnetic sensors comprising magnetoresistive material include giant magneto-resistive sensors and giant magneto-impedance sensors. Other examples are also possible.

Magnetoresistive material is a material with a variable resistance value that varies depending in part on a magnetic field in proximity to the magnetoresistive material. The sensitivity of magnetoresistive material to change its resistance value when exposed to a magnetic field depends in part on the characteristics of a particular magnetoresistive material. Common magnetoresistive materials include anisotropic magnetoresistive (AMR) materials and giant magnetoresistive (GMR) materials which are both described in U.S. Pat. No. 5,569,544 and colossal magnetoresistive (CMR) materials described in U.S. Pat. No. 5,982,178. One type of AMR material is a nickel-iron material known as Permalloy. AMR-type magnetic sensor units may include thin films of Permalloy deposited on a silicon wafer and patterned as a resistor. Multiple resistors made of Permalloy may be coupled together to form an electrical circuit. The electrical circuit could take the form of a bridge configuration, such as a Wheatstone bridge configuration.

Magnetic sensing devices are available in a variety of one-axis and two-axis configurations. The number of axes in a magnetic sensing device refers to the number of sensitive axes or sensing directions for measuring a magnetic field. Magnetic sensing devices with more than one axis typically arrange the multiple axes to be mutually orthogonal. Some forms of three-axis magnetic sensing devices are available but not in the integrated forms as described below.

SUMMARY OF THE INVENTION

The present invention provides a multi-axis (magnetic) field sensing device and method of fabricating a multi-axis (magnetic) field sensing device. An example sensing device is a 3-axis sensor package on a substrate with sensors on opposing sides of the substrate. One side of the substrate includes an X-axis sensor and a Y-axis sensor (or alternatively an integrated X-Y-axis sensor) and the opposite side of the substrate includes a Z-axis sensor on at least one sloped surface, the surface sloped with respect to both the first and second surface areas. One surface is mechanically and electrically bonded to a circuit board via conductive bumps. The other surface electrically connects to the circuit board through bonded wires and/or vias formed through the substrate.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
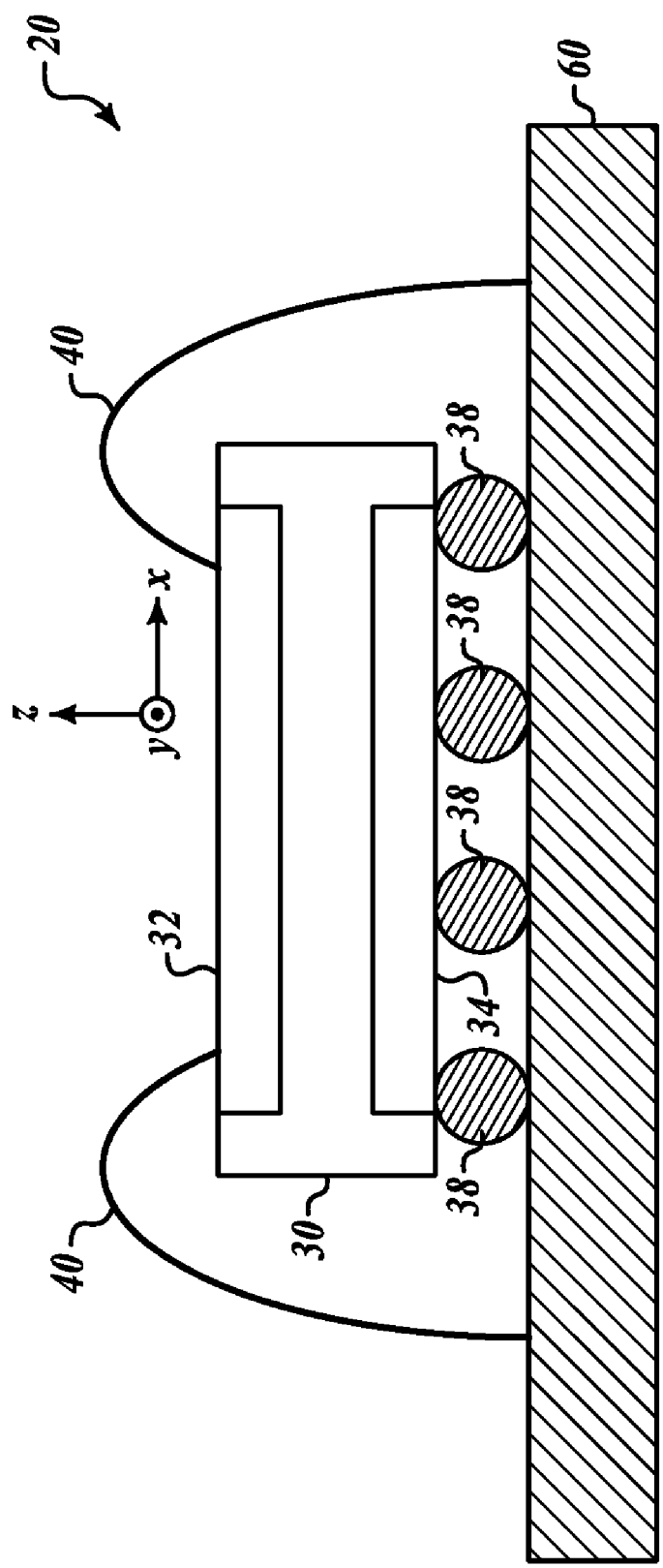
FIG. 1 illustrates a side view of an exemplary 3-axis magnetic sensor.

FIG. 1 illustrates an example integrated 3-axis magnetic sensor 20 formed in accordance with one embodiment. The sensor 20 includes a die 30 that has one or two in-plane (x, y-axis) magnetic sensing elements on one side of the die 30 and an out-of-plane (z-axis) magnetic sensing element on an opposing side of the die 30—see sensing element(s) 32 and 34. Examples of in-plane and out-of-plane sensing elements are described in U.S. Pat. No. 7,126,330, which is hereby incorporated by reference.

The die 30 is attached both mechanically and electrically to a circuit board 60 by interconnection bump(s) 38. The bump(s) 38 may be formed of any of a number of electrically conductive materials that are bondable (e.g., solder) to both the die 30 and the circuit board 60. Examples of Restriction of Hazardous Substances (RoHS) bump materials are SnAgCu and SnAg, and non-RoHS is SnPb. The bump(s) 38 connect to electrical traces (not shown) on the sensing element(s) 34 and on the circuit board 60 using a re-flow process.

Because the sensing element(s) 32 is located on the opposing side of the die 30 from the sensing element(s) 34, and is electrically isolated from the sensing element(s) 34 as well as the circuit board 60 (and the bump(s) 38), one or more wires 40 are soldered or somehow otherwise physically attached to predefined locations on the sensing element(s) 32 side of the die 30 and the circuit board 60 in order to electrically connect to traces on the circuit board 60 and on or in proximity to the sensing element(s) 34.

Figure 2:
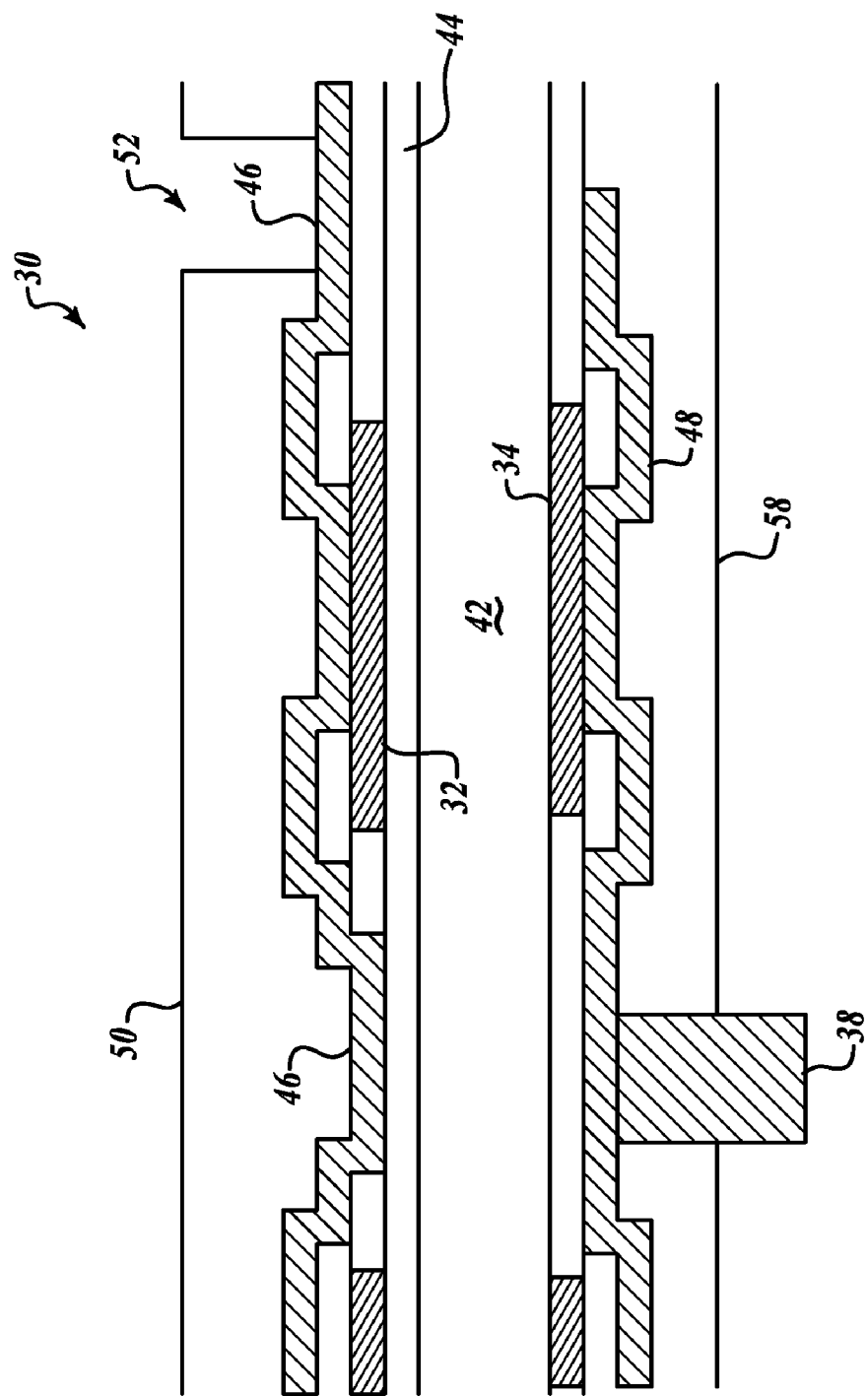
FIG. 2 illustrates a partial cross-sectional view of an example of the sensor shown on FIG. 1.

FIG. 2 illustrates a portion of a cross-sectional view of the die 30 of FIG. 1. An example fabrication for the die 30 includes forming on a first surface of a silicon wafer 42 the first sensing element(s) 32 via standard masking and etching techniques for magneto resistive sensors based on a predefined pattern for the desired sensing element. In an optional embodiment, the wafer 42 is a silicon-on-insulator (SOI) wafer that has a buried dielectric (oxide) layer 44 and the sensing element 42 is etched into a layer of silicon that is located on a top of the dielectric layer 44. After the sensing element(s) 32 has been formed, a metallization (interconnection) layer 46 is applied accordingly to a predefined pattern, thus producing traces that connect to the sensing element(s) 32. Au and Al are typical metals used for the metallization (interconnection) layer 46. Then, a scratch protection (passivation) layer 50 is applied to protect the sensing element(s) 32 and metallization layer 46 from scratching and chemical degradation caused during the fabrication of the sensing element(s) 34 on the opposing side of the die 30 and during assembly on the substrate.

Next, the second sensing element(s) 34 is formed onto the second side of the die 30. The second sensing element 34 is formed directly into the wafer starting with creating at least one sloping surface. Then, a metallization (interconnection) layer 48 is applied over the sensing element(s) 34 according to a predefined pattern similar to the layer 46. Then, the interconnection bump(s) 38 is electrically and mechanically bonded to the metallization (interconnection) layer 48 via soldering and some other known technique. Next, a scratch protection layer 58 is applied over the metallization (interconnection) layer 48 and the sensing element(s) 34. The scratch protection layer 58 is then etched in order to expose a section of the metallization (interconnection) layer 48 for allowing connection of the bump 38. Finally, the scratch protection layer 50 that is applied to the top surface of the die 30 is removed at predefined locations in order to allow for connection of the wires 40 to the metallization layer 46.

Figure 3:
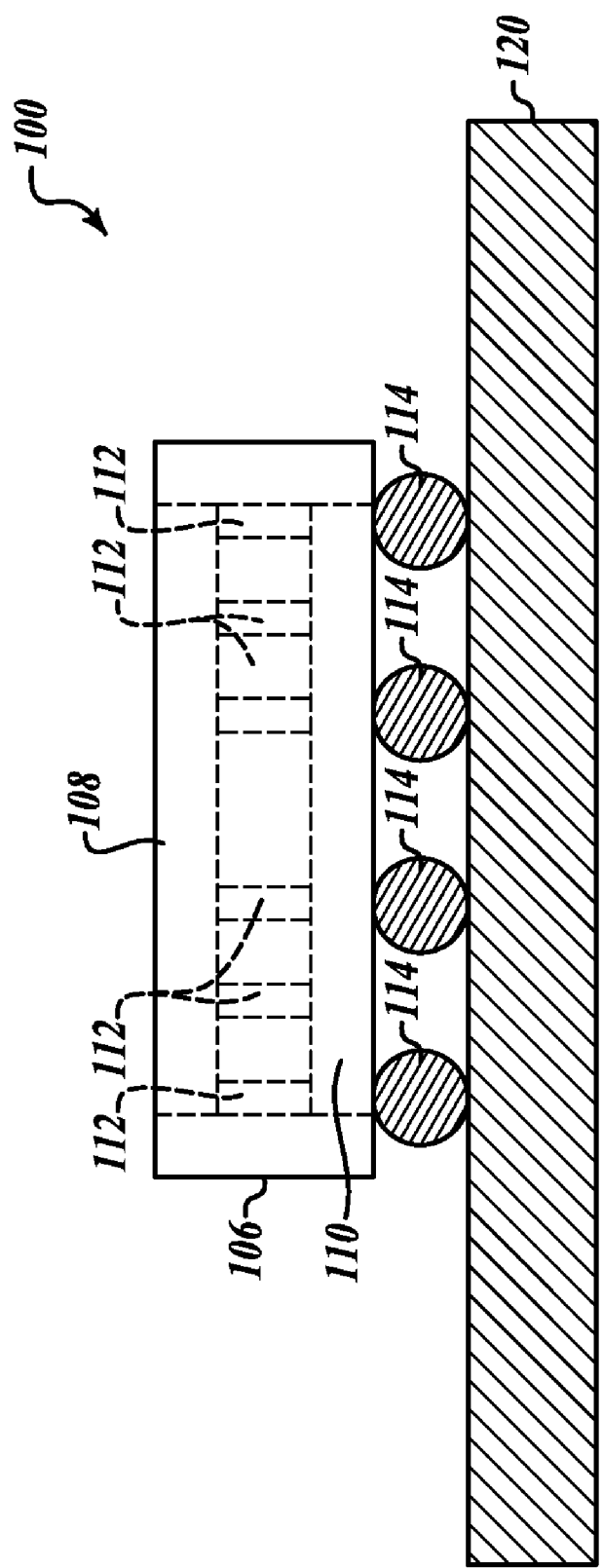
FIG. 3 illustrates a 3-axis magnetic sensor formed in accordance with an alternate embodiment of the present invention.

FIG. 3 illustrates an alternate embodiment of an integrated 3-axis magnetic sensor 100. The magnetic sensor 100 includes a die 106 with a first sensing element(s) 108 located on a first side of the die 106 and a second sensing element(s) 110 located on a second side of the die 106. The sensing elements 108 and 110 are formed in a similar manner to that described above with regard to FIGS. 1 and 2 and with regard to U.S. Pat. No. 7,126,330. The sensor 100 includes one or more vias 112 formed within the die 106 for electrically connecting the first sensing 108 with electrical leads on the second side of the die 106. This allows signals to be passed between the first sensing element 108 and circuit components (not shown) located on a circuit board 120 via bumps 114 that connect the die 106 to the circuit board 120.

Figure 4:
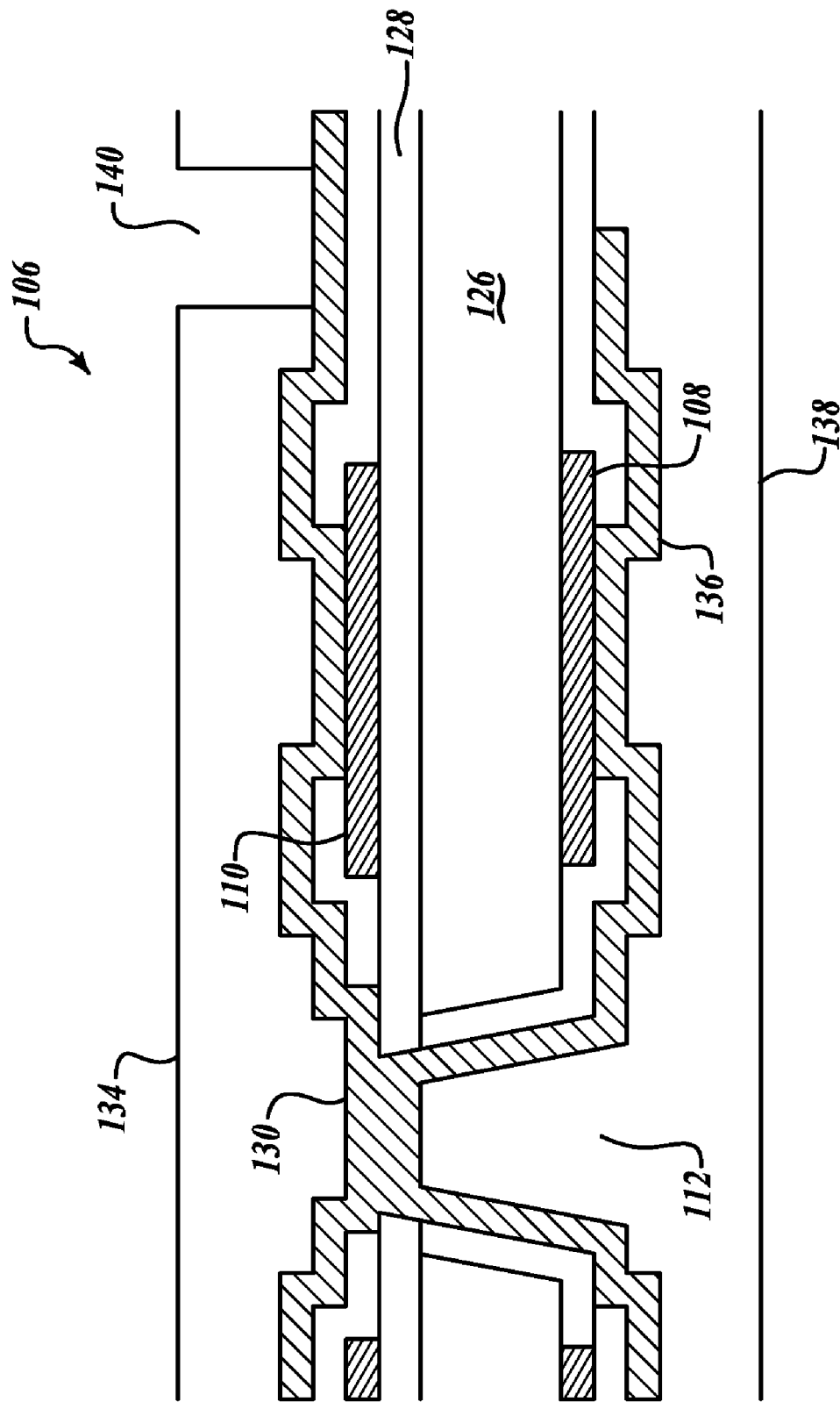
FIG. 4 illustrates a partial cross-sectional view of an example of the sensor shown on FIG. 3.

As shown in FIG. 4, after the second sensing element(s) 110 is formed on the second side of a silicon wafer 126. A metallization (interconnection) layer 130 is formed on the portions of the first sensing element(s) 110. Then, a protection layer 134 is formed over the metallization (interconnection) layer 130 and the second sensing element(s) 110—similar to FIG. 2. Next, a via(s) 112 is formed by etching away the silicon wafer 126 from the first side to the metallization (interconnection) layer 130 using any number of predefined etching techniques (e.g., KOH etch, RIE). The via(s) 112 may be formed before or after the first sensing element(s) 108 has been formed on the first side of the wafer 126. After the via(s) 112 is formed, then a metallization (interconnection) layer 136 is applied according to a predefined pattern in order to electrically connect the first sensing element(s) 108 to the second side of the wafer 126 via the metallization layer 136.

A scratch protection layer 134 is optionally applied over the first side that includes the metallization (interconnection) layer 136 and the first sensing element 108. Finally, in order to connect the die 106 mechanically and electrically to the circuit board 120, the scratch protection layer 134 is removed (e.g., section 140) to expose a portion of the metallization (interconnection) layer 130 at predefined locations. Then, one or more bumps 114 are bonded to the exposed metallization layer 130. This allows signals to be communicated between electric components on the circuit board 120 and any of the sensing elements 108, 110.

Figure 5:
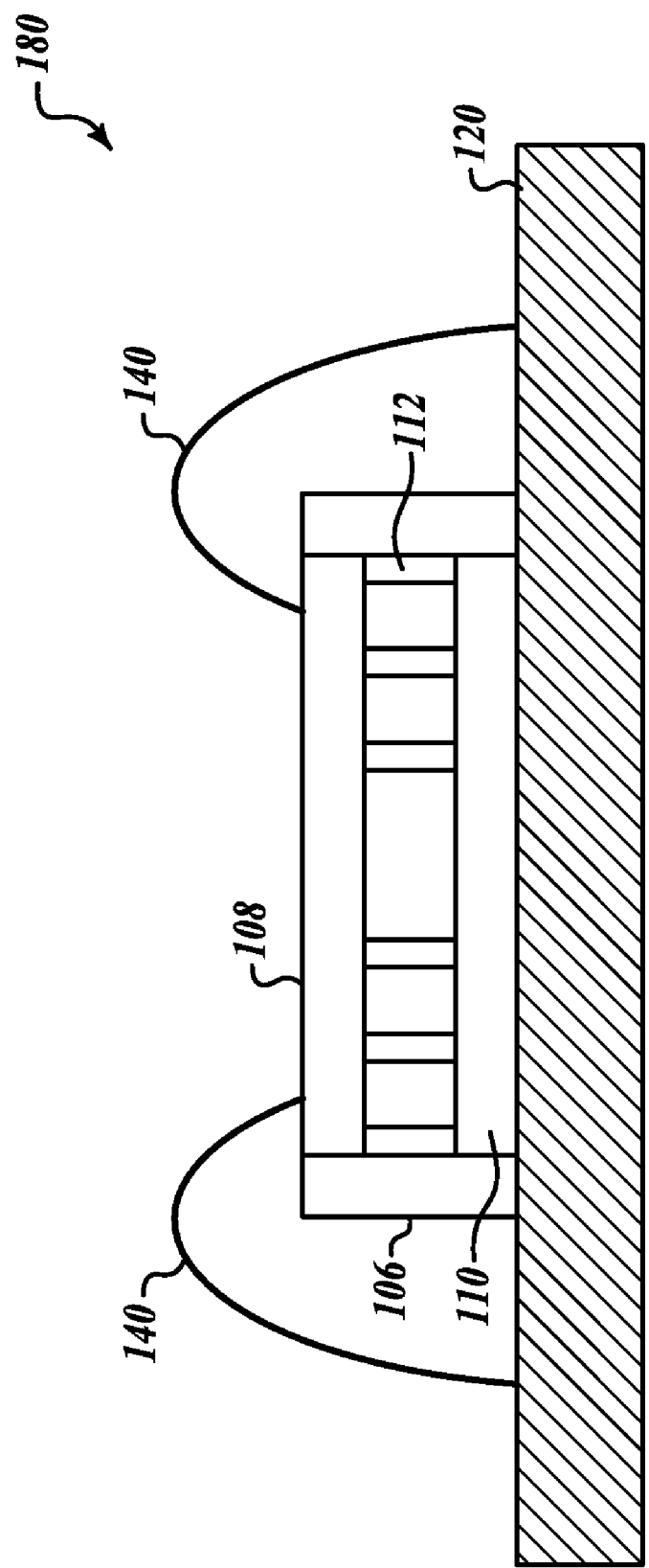
FIG. 5 illustrates a partial cross-sectional view of another example of the present invention.

FIG. 5 illustrates another embodiment of the present invention that is a combination of those shown in FIGS. 1 and 3 to produce a sensor 180. The bumps 38 or 114 are not included. The die 106 is similar to that shown in FIG. 3 with sensing elements 108, 110 on opposing sides of the die with vias 112 through the die 106. However, the die 106 is directly attached to the circuit board 120 (no bumps) and the sensing elements 108, 110 are electrically attached to the circuit board 120 by one or more lead wires 140 attached similar to wires 40.

Figure 6:
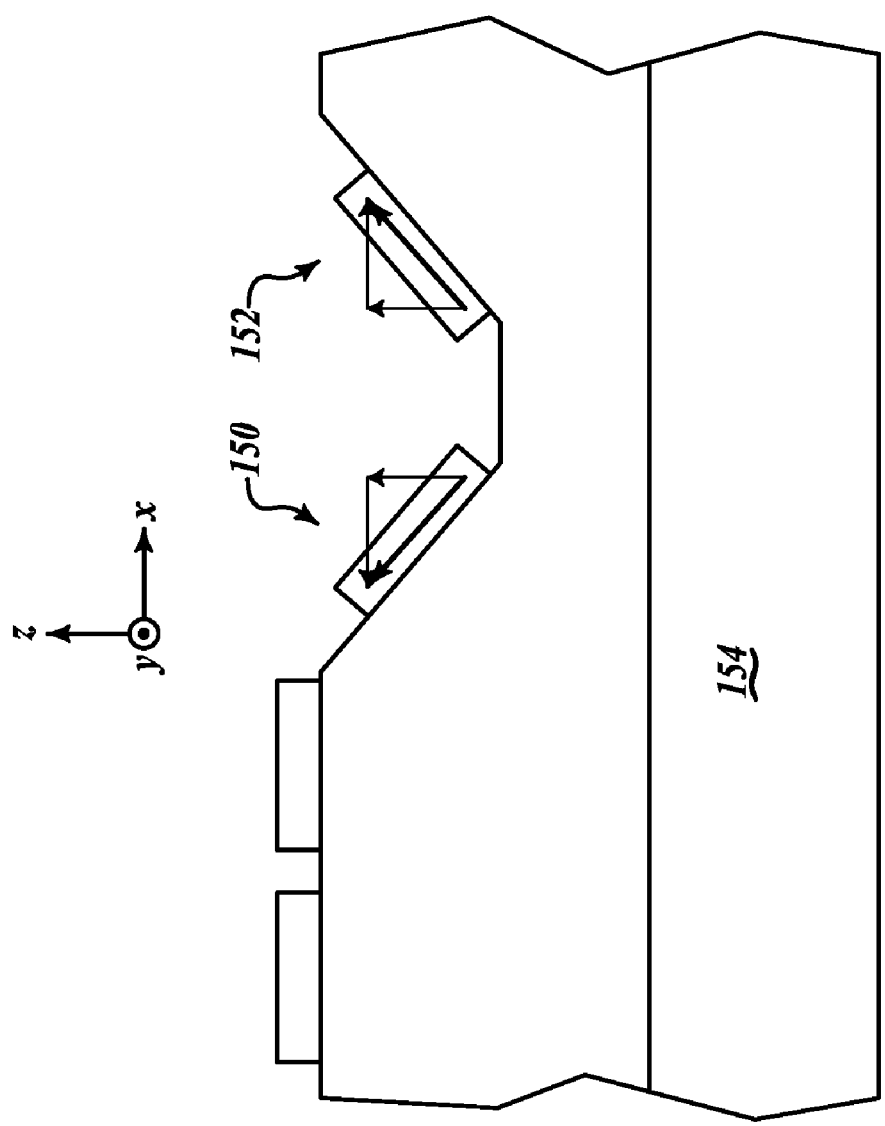
FIG. 6 illustrates a zoomed cross-sectional view of two sensing elements located on the same side of a die.

As shown in FIG. 6, two sensors 150, 152 are formed or attached to sloped surfaces on one side of a die 154. The previously etched sloped surfaces allow the sensors 150, 152 to measure orthogonal fields/forces. This is described in more detail in U.S. Pat. No. 7,126,330.

While the preferred embodiment of the invention has been illustrated and described, as noted above, many changes can be made without departing from the spirit and scope of the invention. For example, the fabrication steps may be performed in any of a number of different orders. Also, some layers such as the protection layer may be an optional addition. Also, the sensors may be other type of field sensors, such as electric, gravitational, etc. The sensors may be any of a number of different types that measure a field or force (e.g., acceleration). Accordingly, the scope of the invention is not limited by the disclosure of the preferred embodiment. Instead, the invention should be determined entirely by reference to the claims that follow.

The embodiment of the invention which an exclusive property or privilege is claimed are defined as follows:

1. An integrated multi-axis field sensing device, the device comprising:
   a wafer with a common substrate, the common substrate having a first surface and an opposing second surface, the first surface and second surface being substantially parallel;
   one or more field sensors formed on the first surface for sensing a field along one or more axes;
   one or more field sensors formed on the second surface for sensing a field along one or more axes;
   one or more bonding devices configured to mechanically bond the first surface to a circuit board and electrically connect the one or more sensors formed on the first surface to a component on the circuit board; and
   one or more devices configured to electrically connect the one or more sensors on the second surface to a component on the circuit board.

2. The device of claim 1, wherein the one or more devices configured to electrically connect the one or more sensors on the second surface to the circuit board comprises one or more wires that are bonded to the one or more sensors and the circuit board.

3. The device of claim 1, wherein the one or more devices configured to electrically connect the one or more sensors on the second surface to the circuit board comprises one or more vias having an electrically conductive material that is formed between the first and second surfaces of the substrate.

4. The device of claim 1, wherein the one or more sensors formed on the first surface comprises one of a sensor configured to measure field out-of-plane of the first surface or a sensor configured to measure field along at least one of two orthogonal axes in-plane of the first surface.

5. The device of claim 1, wherein the one or more sensors formed on the second surface comprises one of a sensor configured to measure field out-of-plane of the second surface or a sensor configured to measure field along at least one of two orthogonal axes in-plane of the second surface.

6. The device of claim 1, wherein the sensors include electrical traces.

7. The device of the claim 6, wherein at least a portion of the electrical traces on both surfaces of the substrate are electrically connected at one or more of the vias.

8. The device of the claim 7, further comprising a protective layer covering at least one of the sensors.

9. The device of claim 1, wherein the one or more bonding devices comprises conductive bumps.

10. The device of claim 1, wherein the field is a magnetic field.

11. A method of fabricating a multi-axis field sensing device, the method comprising:
    forming one or more field sensors for sensing a field along one or more axes on a first surface of a common substrate of a wafer, the common substrate having a second surface opposing the first surface, the second surface being substantially parallel to the first surface;
    forming one or more field sensors on the second surface for sensing a field along one or more axes;
    mechanically and electrically bonding the first surface to a circuit board; and
    electrically connecting the one or more sensors on the second surface and the corresponding one or more sensors to a component on the circuit board.

12. The method of claim 11, wherein electrically connecting comprises bonding one or more wires to the one or more sensors and the circuit board.

13. The method of claim 11, wherein electrically connecting comprises forming one or more vias in the substrate and forming an electrically conductive material between the first and second surfaces of the substrate through the one or more vias.

14. The method of claim 11, wherein the one or more sensors formed on the first surface comprises one of a sensor configured to measure field out-of-plane of the first surface or a sensor configured to measure field along at least one of two orthogonal axes in-plane of the first surface.

15. The method of claim 11, wherein the one or more sensors formed on the second surface comprises one of a sensor configured to measure field out-of-plane of the second surface or a sensor configured to measure field along at least one of two orthogonal axes in-plane of the second surface.

16. The method of claim 11, wherein the sensors include electrical traces.

17. The method of the claim 16, wherein at least a portion of the electrical traces on both surfaces of the substrate are electrically connected at one or more of the vias.

18. The method of the claim 17, further comprising applying a protective layer covering at least one of the sensors.

19. The method of claim 11, wherein mechanically and electrically bonding comprises using conductive bumps.

20. The method of claim 11, wherein the field is a magnetic field.

* * * * *